(12) United States Patent
Kim

(10) Patent No.: US 7,577,887 B2
(45) Date of Patent: Aug. 18, 2009

(54) JTAG INTERFACE DEVICE OF MOBILE TERMINAL AND METHOD THEREOF

(75) Inventor: Bong-Su Kim, Sungnam (KR)

(73) Assignee: LG Electronics Inc., Seoul (KR)

( * ) Notice: Subject to any disclaimer, the term of this patent is extended or adjusted under 35 U.S.C. 154(b) by 553 days.

(21) Appl. No.: 11/221,101

(22) Filed: Sep. 7, 2005

(65) Prior Publication Data

US 2006/0080577 A1  Apr. 13, 2006

(30) Foreign Application Priority Data

Sep. 3, 2004  (KR) .................. 10-2004-0070549

(51) Int. Cl.
*G01R 31/28* (2006.01)

(52) U.S. Cl. .................. 714/727; 714/726; 714/734

(58) Field of Classification Search .................. None
See application file for complete search history.

(56) References Cited

U.S. PATENT DOCUMENTS

| | | | |
|---|---|---|---|
| 5,895,431 A * | 4/1999 | Miller et al. .................. 701/1 |
| 6,167,252 A * | 12/2000 | Cohen .................. 455/410 |
| 6,903,568 B2 * | 6/2005 | Ha et al. .................. 324/765 |
| 7,069,483 B2 * | 6/2006 | Gillies et al. .................. 714/712 |
| 7,257,472 B2 * | 8/2007 | Hauer et al. .................. 701/29 |
| 7,266,824 B2 * | 9/2007 | Chauvel .................. 719/310 |
| 2002/0044536 A1 * | 4/2002 | Izumi et al. .................. 370/329 |
| 2003/0191623 A1 * | 10/2003 | Salmonsen .................. 703/24 |
| 2004/0240425 A1 * | 12/2004 | Chen et al. .................. 370/349 |
| 2005/0070226 A1 * | 3/2005 | Rigge .................. 455/41.3 |
| 2005/0099832 A1 * | 5/2005 | Becker .................. 365/52 |
| 2005/0132226 A1 * | 6/2005 | Wheeler et al. .................. 713/201 |
| 2005/0228980 A1 * | 10/2005 | Brokish et al. .................. 713/2 |
| 2005/0239515 A1 * | 10/2005 | Park .................. 455/569.1 |
| 2006/0001920 A1 * | 1/2006 | Moreno et al. .................. 358/498 |
| 2006/0129848 A1 * | 6/2006 | Paksoy et al. .................. 713/193 |

OTHER PUBLICATIONS

IEEE Standard Test Access Port and Boundary-Scan Architecture, Jun. 14, 2001.*

* cited by examiner

*Primary Examiner*—John P Trimmings
*Assistant Examiner*—Guerrier Merant
(74) *Attorney, Agent, or Firm*—Lee, Hong, Degerman, Kang & Waimey

(57) ABSTRACT

A JTAG interface device capable of effectively debugging a mobile terminal by interfacing the mobile terminal with a JTAG emulator without an additional interface unit by allocating test pins of the JTAG emulator to some pins of a receptacle and then electrically connecting the test pins to the pins, and a method thereof. Accordingly, an operation for debugging the mobile terminal can be easily and effectively performed.

11 Claims, 2 Drawing Sheets

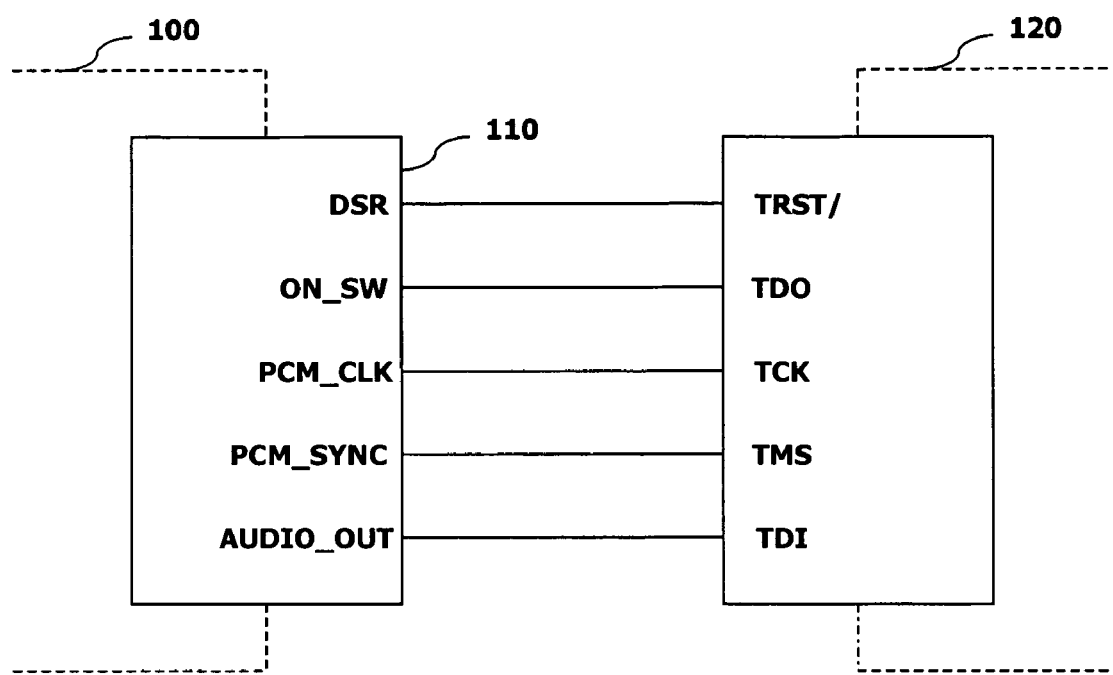

JTAG INTERFACE DEVICE OF MOBILE TERMINAL AND METHOD THEREOF

CROSS-REFERENCE TO RELATED APPLICATIONS

Pursuant to 35 U.S.C. § 119(a), this application claims the benefit of earlier filing date and right of priority to Korean Application No. 70549/2004 filed Sep. 3, 2004, the contents of which are hereby incorporated by reference herein in its entirety.

FIELD OF THE INVENTION

The present invention relates to a mobile terminal, and more particularly, to a joint test action group (JTAG) interface device using a receptacle and a method thereof.

BACKGROUND OF THE INVENTION

As communication techniques develop rapidly and users desire more functions, a mobile communication terminal (hereinafter, a mobile terminal) provides not only voice information but also text information (such as a stock data, weather, and real time news) and multimedia services multimedia services (such as games and videos.)

However, in order to provide the above services, the number of components and circuits mounted in the mobile terminal has increased, and thereby increasing the time and cost to test for errors of the components and the circuits. To address the problem of testing an increased number of components and circuits, the Joint Test Action Group (JTAG) has developed a boundary-scan testing standard that has been widely adopted. The standard has been published by the IEEE as IEEE Std. 1149.1, and is incorporated herein by reference.

Boundary testing defines a bus structure for testing internal components and circuits. Generally, an exclusive emulator for debugging and testing hardware is provided for testing component and circuit malfunctions. Presently, a JTAG type emulator is being used for this purpose. The JTAG type emulator is an emulator for debugging hardware by mounting standardized logic and test pins for testing a large-scale integrated circuit (LSI) such as a complex programmable logic device (CPLD).

The JTAG type emulator interface requires an additional device such as a flexible printed circuit board (FPCB), and basically the emulator interface comprises five test signals: a test reset (TRST), test data out (TDO), a test clock (TCK), a test mode select (TMS), and a test data in (TDI). The test signals are directly connected to an FPCB, which further connect to components or circuits. A mobile station mode (MSM) controller tests for hardware or connection states.

However, to test circuits and components using the conventional JTAG emulator, a separate space for a JTAG interface is required, but space is a limiting factor in mobile terminal design. Also, the physical configuration for a JTAG interface is different for each mobile terminal design with little standardization. Accordingly, each mobile terminal has to be provided with an additional device for the JTAG interface such as an FPCB.

SUMMARY OF THE INVENTION

Therefore, an object of the present invention is to provide a JTAG interface device for interfacing a mobile terminal and a JTAG unit, and a method thereof.

Another object of the present invention is to provide a JTAG interface device for interfacing a mobile terminal and a JTAG unit without an additional interface unit, and a method thereof.

To achieve these and other objectives and in accordance with the purpose of the present invention, as embodied and broadly described herein, there is provided a JTAG interface device comprising: a mobile terminal; a JTAG emulator for debugging the mobile terminal; and a receptacle having a plurality of pins corresponding to test pins of the JTAG emulator, for directly interfacing the mobile terminal and the JTAG emulator. Preferably, the receptacle test pins are connected to the following signals present in the mobile terminal: data set ready (DSR), on switch (ON_SW), pulse code modulation clock (PCM_CLK), PCM synchronization (PCM_SYNC), and audio out signal (AUDIO_OUT). Preferably, the test pins are included in a single receptacle.

To achieve these and other advantages and in accordance with the purpose of the present invention, as embodied and broadly described herein, there is also provided a JTAG interfacing method of a mobile terminal comprising: allocating test pins of a JTAG emulator to pins of a receptacle on a one-to-one basis; and directly connecting the allocated test pins to each pin of the receptacle thereby debugging a mobile terminal.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIG. 2 is a view showing a connection state between pins of a receptacle and test pins of a JTAG emulator in FIG. 1.

DETAILED DESCRIPTION OF THE PREFERRED EMBODIMENTS

Figure 1:
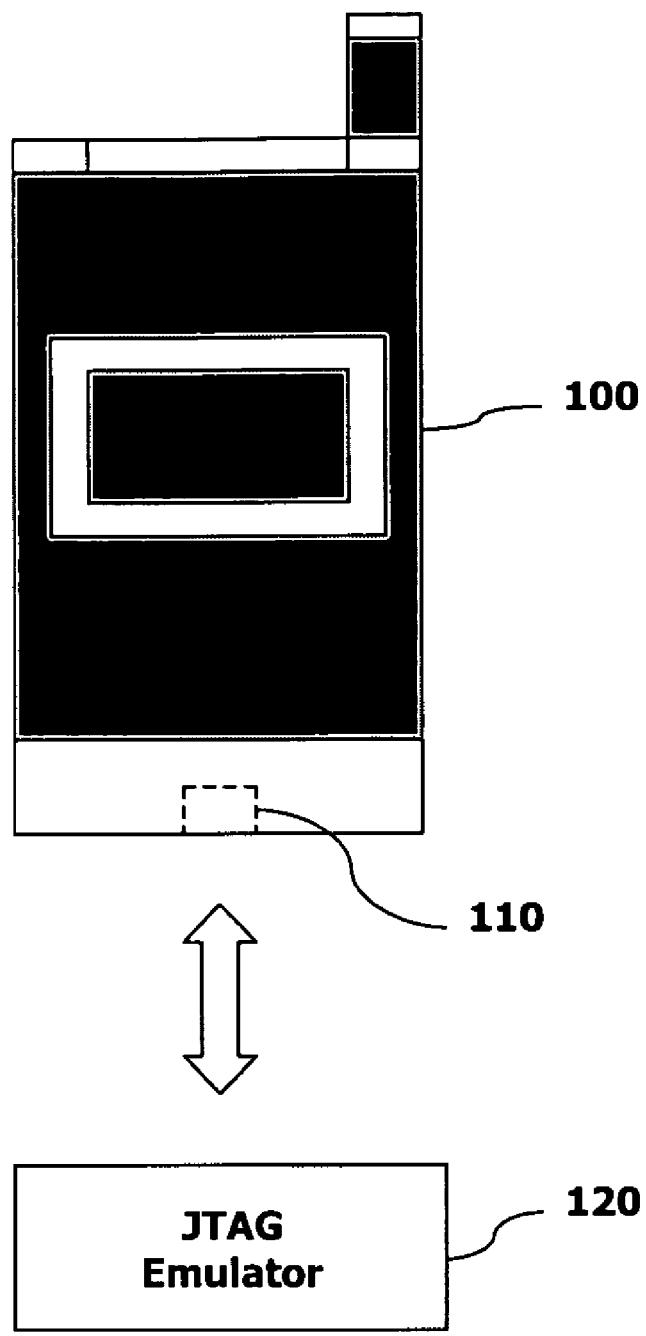
FIG. 1 is a view showing a JTAG interface device of a mobile terminal according to a preferred embodiment of the present invention.

Reference will now be made in detail to the preferred embodiments of the present invention, examples of which are illustrated in the accompanying drawings.

The present invention provides a JTAG interface device for interfacing a mobile terminal and a JTAG emulator by using a 24-pin receptacle. In the present invention, JTAG emulator test signals are allocated to specific pins of a 24-pin plug. The JTAG emulator plug is directly connectable to the mobile terminal receptacle, thereby facilitating the debugging of components and circuits of a mobile terminal.

FIG. 1 shows a JTAG interface device of a mobile terminal according to an embodiment of the present invention, wherein a JTAG interface comprises a mobile terminal 100, a JTAG emulator 120 for debugging components or circuits of the mobile terminal 100, and a receptacle 110 for directly interfacing the mobile terminal 100 and the JTAG emulator 120.

The mobile terminal 100 has certain test signals connected to pins of receptacle 100. The receptacle pins are connected to the following test signals present in the mobile terminal: data set ready (DSR), on switch (ON_SW), pulse code modulation clock (PCM_CLK), PCM synchronization (PCM_SYNC), and audio out signal (AUDIO_OUT).

The JTAG emulator 120 is provided with five test signals: a test reset (TRST), test data out (TDO), a test clock (TCK), a test mode select (TMS), and a test data in (TDI). The TRST is an initial signal for a test, the TDO is a data output signal, the TCK is a clock signal for a test, the TMS is a mode selection signal for a test, and the TDI is input data.

The mobile terminal 100 test signals are connected to the JTAG emulator 120 test signals through receptacle 110 as follows: PCM_CLK to the TCK, PCM_SYNC to TMS, AUDIO_OUT to TDI, DSR to TRST, and ON_SW to TDO. Preferably, the TRST signal, the TDO signal, the TCK signal, the TMS signal and the TDI signal are included in one plug so as to be easily connectable to the receptacle. Preferably, the JTAG emulator 120 includes all the five test pins so that each test pin of the JTAG emulator 120 can be electrically connected to the corresponding pin of receptacle 110.

The receptacle 110 is composed of 24 pins generally provided to a mobile terminal. Some pins of the receptacle 110 are allocated to the test signals TRST, TDO, TCK, TMS, and TDI of the JTAG emulator 120. That is, the TDI signal which is a pull up input signal is connected to the AUDIO OUT (bi-directional pull up) signal having the same characteristic, the TMS signal having a high impedance output pin is connected to the PCM SYNC (bi-directional pull down) signal, and the TCK signal, which is a pull up input pin, is connected to the PCM_CLK signal.

When certain pins of the receptacle 100 are connected to the test pins of the JTAG emulator 120, interferences between the signals and the operation of the mobile terminal 100 have to be considered. For example, since the DSR signal is scarcely used at the time of a data communication, DSR is connected to the TRST signal. Also, the ON_SW signal used to detect an input of an external power is connected to the TDO signal.

FIG. 2 shows connections between the receptacle 110 signals and the JTAG emulator 120 test signals. As some signals of the receptacle 110 are allocated to the JTAG emulator 120 test signals, the mobile terminal can be interfaced with the JTAG emulator 120 through the receptacle 110 without an additional interface unit.

The JTAG interface device of a mobile terminal according to one embodiment of the present invention will be explained in more detail with reference to the attached drawings.

In the present invention, the third, sixth, eighth, ninth, and eleventh pins of the receptacle 110 are allocated to the test pins of the JTAG emulator 120. Accordingly, it is also possible to allocate other pins of the receptacle to the test signals of the JTAG emulator within a range of minimizing interference between each pin.

The JTAG signals of the JTAG emulator 120 (TRST, TDO, TCK, TMS and TDI) are allocated to specific pins of the 24-pin receptacle 110. Then, a plug of the JTAG emulator 120 is directly inserted into the receptacle 110 to which each JTAG signal is allocated, thereby connecting the JTAG emulator to the mobile terminal. Accordingly, the TRST signal of the JTAG emulator 120 is the third pin of the receptacle 110, the TDO signal is the sixth pin, the TCK signal is the eighth pin, the TSM signal is the ninth pin, and the TDI signal is the eleventh pin.

That is, the JTAG emulator 120 transmits each test signal to the mobile terminal 100 through the pins of the receptacle 110 to control a controller of the mobile terminal 100 such as a mobile station mode (MSM). Accordingly, a debugging operation for testing components or a connection state of the mobile terminal 100 is performed.

As described above in the present invention, the test pins of the JTAG emulator 120 are allocated to some pins of the receptacle 110 provided at the mobile terminal 100, and then are electrically connected to the mobile terminal 100 test signals, thereby interfacing the mobile terminal 100 to the JTAG emulator 120 without an additional interface unit. Especially, in the present invention, the mobile terminal 100 is directly interfaced with the JTAG emulator 120 through the receptacle 110 without an additional interface unit, thereby reducing a debugging cost, minimizing space in the mobile terminal, and solving a problem caused as various components are mounted in the mobile terminal.

Also, in the present invention, it is convenient to debug components or a connection state of the mobile terminal, and thereby operational efficiency can be enhanced.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalence of such metes and bounds are therefore intended to be embraced by the appended claims.

What is claimed is:

1. A testing system for a mobile terminal, the system comprising:
a testing unit having a plug with a plurality of test pins for debugging the mobile terminal; and
a receptacle mounted in the mobile terminal and having a plurality of pins corresponding to test pins of the testing unit for directly interfacing the mobile terminal with the testing unit, wherein each of the plurality of pins of the receptacle is connected to one of the plurality of test pins of the testing unit and wherein a test clock signal (TCK), a test mode select signal (TMS), a test data in signal (TDI), a test reset signal (TRST), and a test data out signal (TDO) of the testing unit are respectively connected with a pulse code modulation signal (PCM_CLK), a synchronization signal (PCM_SYNC), an audio out signal (AUDIO_OUT), a data set ready signal (DSR), and a power on signal (ON_SW) of the mobile terminal.

2. The system of claim 1, wherein the testing unit is a Joint Test Action Group (JTAG) emulator.

3. The system of claim 1, wherein the TCK, TMS, TDI, TRST, and TDO signals are included in one plug.

4. The system of claim 1, wherein an existing receptacle of the mobile terminal is adapted to accommodate the testing unit plug.

5. The system of claim 4, wherein at least one of the plurality of pins of the existing receptacle that is connected to one of the plurality of test pins of the testing unit plug is used for a communication function of the mobile terminal.

6. A method of interfacing a testing unit to a mobile terminal for debugging the mobile terminal through the testing unit, the method comprising:
allocating a plurality of test pins of a plug of the testing unit to a plurality of pins of a mobile terminal receptacle;
connecting each of the plurality of test pins of the testing unit plug to one of the plurality of pins of the mobile terminal receptacle, wherein a test clock signal (TCK), a test mode select signal (TMS), a test data in signal (TDI), a test reset signal (TRST), and a test data out signal (TDO) of the testing unit are respectively connected with a pulse code modulation signal (PCM_CLK), a synchronization signal (PCM_SYNC), an audio out signal (AUDIO_OUT), a data set ready signal (DSR), and a power on signal (ON_SW) of the mobile terminal; and performing debugging of the mobile terminal.

7. The method of claim 6, wherein the plurality of test pins is included in one plug.

8. A method of interfacing a testing unit to a mobile terminal for debugging the mobile terminal through the testing unit, the method comprising:

allocating a plurality of test pins of a plug of the testing unit to a plurality of pins of an existing mobile terminal receptacle;

connecting each of the plurality of test pins of the testing unit plug to one of the plurality of pins of the mobile terminal receptacle, wherein a test clock signal (TCK), a test mode select signal (TMS), a test data in signal (TDI), a test reset signal (TRST), and a test data out signal (TDO) of the testing unit are respectively connected with a pulse code modulation signal (PCM_CLK), a synchronization signal (PCM_SYNC), an audio out signal (AUDIO_OUT), a data set ready signal (DSR), and a power on signal (ON_SW) of the mobile terminal; and performing debugging of the mobile terminal.

9. The method of claim 8, wherein the existing mobile terminal receptacle is adapted to accommodate the plurality of pins corresponding to the test pins of the testing unit.

10. The method of claim 9, wherein at least one of the plurality of pins of the existing mobile terminal receptacle that is connected to one of the plurality of test pins of the testing unit is used for a communication function of the mobile terminal.

11. A method of interfacing a testing unit to a mobile terminal for debugging the mobile terminal through the testing unit, the method comprising:

adapting an existing mobile terminal receptacle to accommodate a plug of the testing unit having a plurality of test pins;

allocating the plurality of test pins of the testing unit plug to a plurality of pins of the existing mobile terminal receptacle;

connecting each of the plurality of test pins of the testing unit plug to one of the plurality of pins of the mobile terminal receptacle, wherein a test clock signal (TCK), a test mode select signal (TMS), a test data in signal (TDI), a test reset signal (TRST), and a test data out signal (TDO) of the testing unit are respectively connected with a pulse code modulation signal (PCM_CLK), a synchronization signal (PCM_SYNC), an audio out signal (AUDIO_OUT), a data set ready signal (DSR), and a power on signal (ON_SW) of the mobile terminal; and performing debugging of the mobile terminal, wherein at least one of the plurality of pins of the existing mobile terminal receptacle that is connected to one of the plurality of test pins of the testing unit is used for a communication function of the mobile terminal.

\* \* \* \* \*

UNITED STATES PATENT AND TRADEMARK OFFICE
CERTIFICATE OF CORRECTION

PATENT NO. : 7,577,887 B2 Page 1 of 1
APPLICATION NO. : 11/221101
DATED : August 18, 2009
INVENTOR(S) : Bong-Su Kim It is certified that error appears in the above-identified patent and that said Letters Patent is hereby corrected as shown below:

Title Page: (22) Filed; "Sep. 7" should read -- Sep. 6 --.

Signed and Sealed this

Seventeenth Day of November, 2009

David J. Kappos
*Director of the United States Patent and Trademark Office*